United States Patent [19]

Kenney

[11] Patent Number: 5,684,314
[45] Date of Patent: Nov. 4, 1997

[54] TRENCH CAPACITOR PRECHARGE STRUCTURE AND LEAKAGE SHIELD

[76] Inventor: Donald M. Kenney, 18 Birch Rd., Shelburne, Vt. 05482

[21] Appl. No.: 617,138

[22] Filed: Mar. 18, 1996

[51] Int. Cl.$^6$ .......................... H01L 27/108; H01L 29/94
[52] U.S. Cl. .............................. 257/297; 257/301
[58] Field of Search ........................ 257/297, 301, 257/305

[56] References Cited

U.S. PATENT DOCUMENTS

| | | | |
|---|---|---|---|
| 4,163,245 | 7/1979 | Kinoshita | 257/297 |
| 4,635,085 | 1/1987 | Taguchi | 257/297 |
| 4,658,283 | 4/1987 | Koyama | 257/297 |
| 4,801,988 | 1/1989 | Kenney | 357/23.6 |
| 4,833,647 | 5/1989 | Maeda et al. | 257/297 |
| 5,410,169 | 4/1995 | Yamamoto et al. | 257/301 |
| 5,414,656 | 5/1995 | Kenney | 365/149 |
| 5,512,767 | 4/1996 | Noble | 257/301 |

OTHER PUBLICATIONS

Kenney et al., "16-Mbit Merged Isolation and Node Trench SPT Cell," IEEE Symposium on VLSI Technology, May, 1988, pp. 25-26.

Bakeman et al., "A High Performance 16-Mb DRAM Technology," IEEE Symposium on VLSI Technology, Jun., 1990.

U.S. application No. 08/603,832, Kenney, filed Feb. 20, 1996.

*Primary Examiner*—Gene M. Munson

[57] ABSTRACT

An integrated structure is provided that includes a DRAM cell with a trench storage capacitor, and a corresponding storage node precharge circuit. The entire structure ideally requires only eight square features of area per memory bit. The structure also provides a partial leakage current shield for the DRAM storage node diffusion, thereby improving the data hold time. A graded impurity region around the storage node diffusion enhances the leakage shielding effect. The structure can be operated independently as a DRAM leakage shield if the precharge circuit is not needed. In that case, a junction diffusion in the structure can be eliminated and a leakage shielding effect is still achieved.

20 Claims, 2 Drawing Sheets

TRENCH CAPACITOR PRECHARGE STRUCTURE AND LEAKAGE SHIELD

FIELD OF INVENTION

This invention applies to trench capacitor DRAM memory arrays having storage node leakage current related to the trench structure, and to trench capacitor memory arrays in which storage elements are precharged prior to a data write operation.

BACKGROUND OF THE INVENTION

U.S. Pat. No. 5,414,656 issued May 9, 1995 to Kenney describes a precharge circuit for DRAM memory cells which allows a very low rate of electric charge consumption from a power supply to be achieved. According to U.S. Pat. No. 5,414,656 a DRAM precharge circuit can be a single precharge transistor connected between each cell storage node and a precharge voltage source. All the precharge transistors along an individual access word line of the DRAM array are controlled by a corresponding, and parallel, precharge word line. The precharge circuit is illustrated using conventional planar transistor structures integrated with a widely used stacked capacitor type cell. The structure results in an array area of eight square features per memory bit when the precharge circuit is included with the DRAM cell as part of the array area. This bit density is equivalent to that of common DRAM array structures that do not include a precharge circuit. As a result, a DRAM with precharge circuits can be cost competitive with conventional DRAM products.

The concept of measuring array bit areas in square features is widely used, but a brief explanation is made here for clarity. Since a memory bit must be electrically addressed in both row and column dimensions of a memory array, at least one conductive line is required in each row and column of the array in order to uniquely address each bit or "cell". A conductive line along either a row or a column of the array may serve all bits located in the row or column. Thus, an array of N by M bits will require at least N by M conductive lines to electrically address all bits in the array. A bit can be thought of as occupying the area at the intersection of a row and a column. The minimum size of the intersection, in both row and column directions, is a conductive line width plus the width of the space between conductive lines. If both the conductive line width and space are each considered to be a "feature" in size, then the minimum area of a bit is two features by two features, or four square features in area (i.e. 2F×2F=4F²).

As technology is improved, the feature size is reduced, and so is the bit size, but the minimum bit is still said to be four square features in area. Most DRAM arrays manufactured to date have an ideal bit area of eight square features. In practice, various process tolerances generally prevent the ideal eight square feature size from being fully realized.

U.S. Pat. No. 4,801,988 "Semiconductor Trench Capacitor Cell with Merged Isolation and Node Trench Construction," issued to Kenney, Jan. 31, 1989, describes a widely used DRAM cell structure having trench storage capacitors that also function as isolation structures. In general, trench capacitor structures allow much of the minority carrier leakage current generated in the immediate vicinity of the trench to flow to the DRAM storage node. For example, minority carries generated on all silicon surfaces bounding a storage trench tend to be confined by the surface potential, and diffuse along the trench surface, eventually reaching an adjacent storage node junction. Similarly, many minority carriers generated at a distance from a trench reach the trench by bulk diffusion, and then diffuse along trench surfaces to the storage node junction. Current thus collected by a storage node reduces the critical data hold time, or retention time, of the memory. Therefore, a need exists for trench capacitor structures that reduce the amount of leakage current flowing to storage nodes. Also needed is a structure efficiently integrating a storage node precharge circuit with a trench capacitor. The entire structure should require no more than eight square features of array area per bit, so as to be competitive with stacked capacitor type products.

SUMMARY OF THE INVENTION

An object of the present invention is to provide a structure in which a trench capacitor DRAM cell and an associated precharge circuit require a total of eight square features of array area per memory bit.

A further object is to provide an array structure which collects minority carrier leakage current, and thereby reduces leakage current flowing to a trench DRAM storage capacitor.

In order to achieve the above objects according to the present invention, a new junction diffusion is introduced into the array structure. The junction is disposed adjacent to trench capacitors, and collects a significant portion of leakage current that normally flows to the storage node from the immediate vicinity of the trench. The current thus collected flows to a voltage source and never reaches the storage node, resulting in improved data retention time. Collection of leakage current at the new junction is enhanced by a doping gradient introduced around storage node junctions.

The new junction diffusion also serves as a precharge voltage source for a storage node precharge circuit integrated with the DRAM cell. The total integrated structure can be operated simply to improve data retention time, or to both improve retention and to precharge storage nodes.

REFERENCE NUMERALS IN THE DRAWINGS

Figure 1A:
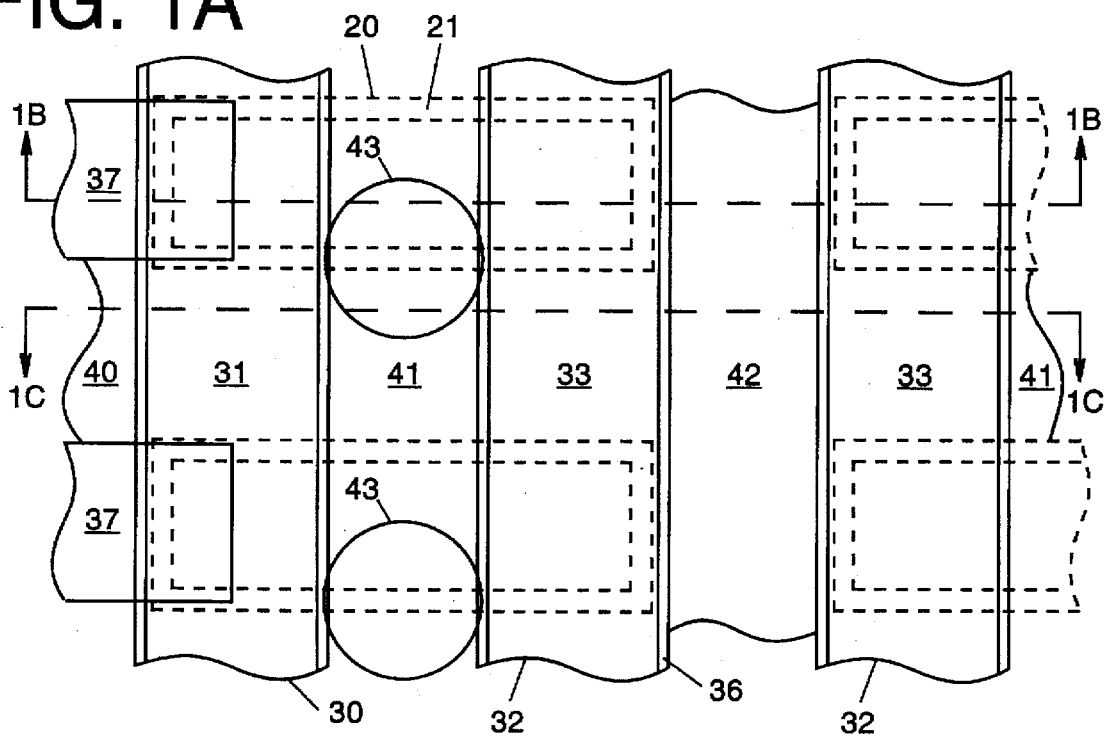
FIG. 1A is a top view of the invention.

10 Semiconductor substrate
20 Storage capacitor trench
21 Dielectric
22 Storage node dielectric
23 Poly silicon
24 Dielectric
30 Poly silicon
31 Channel region
32 Poly silicon
33 Channel region
34 Gate dielectric
35 Cap dielectric
36 Sidewall dielectric
37 Isolation dielectric
38 Dielectric
40 Bit line diffusion
41 Storage node diffusion
42 Diffusion
43 Poly silicon
50 Doped layer
51 Doped layer
53 Doped region

DETAILED DESCRIPTION OF THE PREFERRED EMBODIMENTS

Figure 1B:
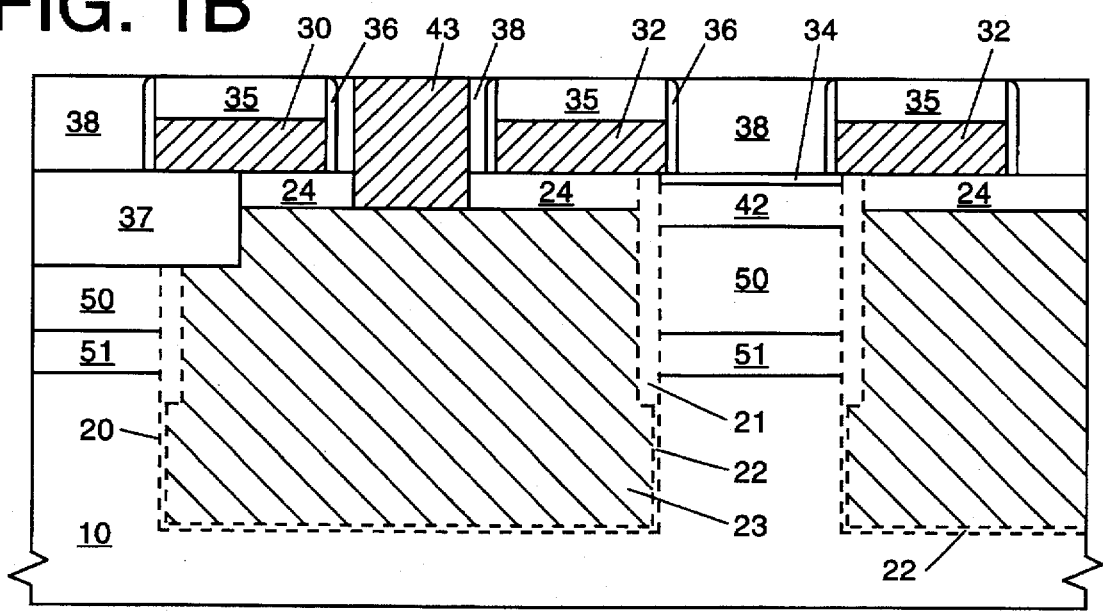
FIG. 1B is a first sectional view of FIG. 1A.
Figure 1C:
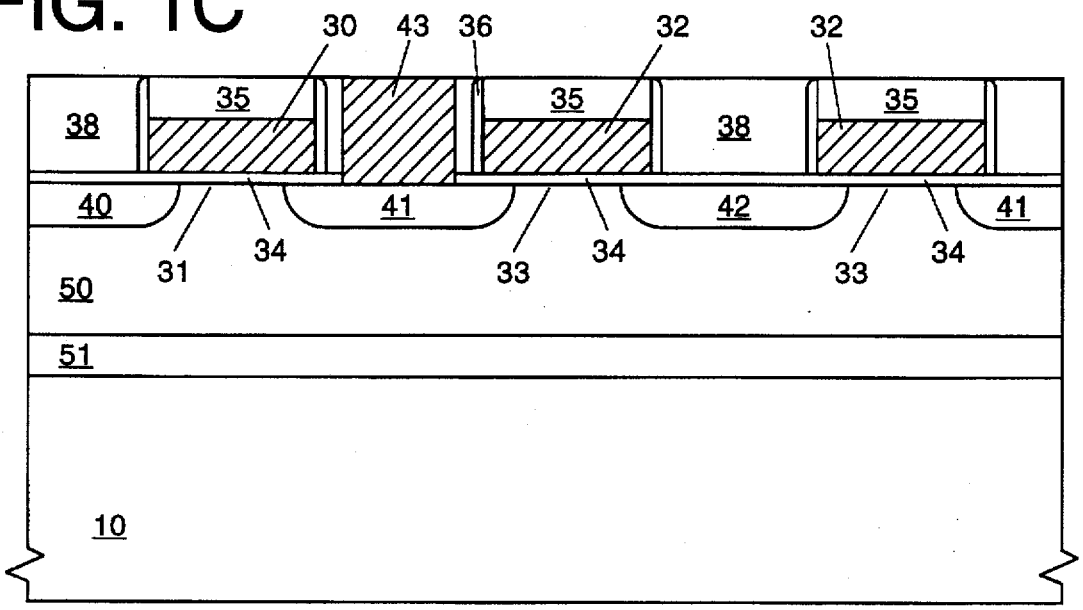
FIG. 1C is a second sectional view of FIG. 1A.

FIG. 1A is an illustrative top view of a preferred embodiment of the present invention. One full DRAM cell and associated storage node precharge circuit from a large memory array are shown. Portions of adjacent cells and precharge circuits are also shown so that the repetitive array structure is discernible. FIGS. 1B and 1C are simplified cross sections of FIG. 1A as indicated.

Merged isolation and storage node trench structures 20 are depicted using dashed lines to distinguish them visually from other structures. Thus, the dashed lines do not represent conventional hidden lines and should not be viewed as such. Relatively thick isolation dielectric 21 surrounds the upper portion of the trench and is adjacent to the trench sidewalls. As shown in FIG. 1B, relatively thin storage capacitor dielectric 22 is on the remainder of the trench surfaces. In actual use, the thin dielectric portion of trench 20 reaches proportionally deeper into silicon substrate 10 than FIG. 1B indicates. The thin dielectric portion is shown reduced in order to minimize the drawing height, and because the thin dielectric portion does not affect the present invention. Trench 20 is substantially filled with a poly crystalline silicon (poly silicon) storage node conductor 23, shown with the larger spaced hatching in FIG. 1B. Poly silicon 23 and substrate 10 constitute the storage node plate and reference plate electrodes, respectively, of the DRAM cell storage capacitor. Cap dielectric 24 in trench 20 insulates poly silicon 23 from overlying elements.

DRAM cell access word line 30 gates access transistor channel region 31. Precharge word lines 32 gate precharge transistor channel regions 33. Both 30 and 32 are conductive poly crystalline silicon material, and have the smaller spaced hatching in FIGS. 1B and 1C. Gate dielectric 34, cap dielectric 35, and sidewall dielectric 36 insulate word lines 30 and 32 from other elements.

In FIGS. 1B and 1C doped layers 50 and 51 in substrate 10 are of opposite conductivity type to substrate 10 and form a doped well in substrate 10. Layer 50 is more lightly doped than layer 51 so as to provide a common retrograde doping profile in which the doping concentration decreases from a peak in layer 51 to a lower concentration in layer 50. The retrograde doping profile is preferred because it produces superior transistor and isolation parameters. However, the retrograde profile has an undesirable result of producing a vertical electric field within the well, which tends to confine minority carriers generated in layer 50. Minority carriers generated above the peak of doping concentration in layer 51, or within layer 50, or on the trench surfaces adjacent to layer 50, therefore tend to be collected at reverse biased PN junctions formed within layer 50. Minority carries generated below the peak of doping concentration in layer 51 tend to be collected at the junction of layer 51 with substrate 10.

DRAM bit line junction diffusions 40 are of opposite conductivity type to layer 50 and form PN junctions, and will be referred to as either "junction 40" or "diffusion 40." Conventional connecting bit line structures that normally run above and orthogonal to word lines 30 are not shown in FIGS. 1A–1C for simplicity. These connecting lines usually reach diffusions 40 via contact holes in dielectric 38, also not shown for simplicity. The unillustrated connecting bit lines and contact holes do not affect the present invention. Mirror image DRAM cells exist to either side of a center point of diffusion 40.

Storage node junction diffusions 41, disposed adjacent trenches 20, are of opposite conductivity type to layer 50 and form PN junctions, and will be referred to as either "junction 41" or "diffusion 41." Poly silicon contact studs 43 connect storage node diffusions 41 to corresponding storage node plates 23. Studs 43 are hatched in FIGS. 1B and 1C, similarly to poly silicon word lines 30 and 32. Note PN junctions formed by diffusions 40 and 41 are generally adjacent more than one storage capacitor trench, and collect minority carriers from surfaces of each adjacent trench.

Normally, most minority carries generated within layer 50, and the trench surfaces adjacent layer 50, are collected by diffusions 40 and 41. Those collected at diffusions 41 constitute storage node leakage current and degrade the data retention time.

The present invention introduces diffusion 42 (also referred to as junction 42) adjacent to the storage capacitor trenches 20, and spaced apart from diffusions 40 and 41. Diffusion 42 is disposed between precharge word lines 32 and extends parallel to them. It is connected to a voltage source, and as one of three separate PN junctions in layer 50, tends to collect about one third of the minority carrier leakage current generated above layer 51. This reduces leakage current at storage node diffusions 41, and thereby improves the memory data retention time. Further, junction 42 can usually be more strongly reverse biased than junctions 40 and 41, and will thereby tend to collect more minority carriers and proportionately improve data retention time.

Figure 2:
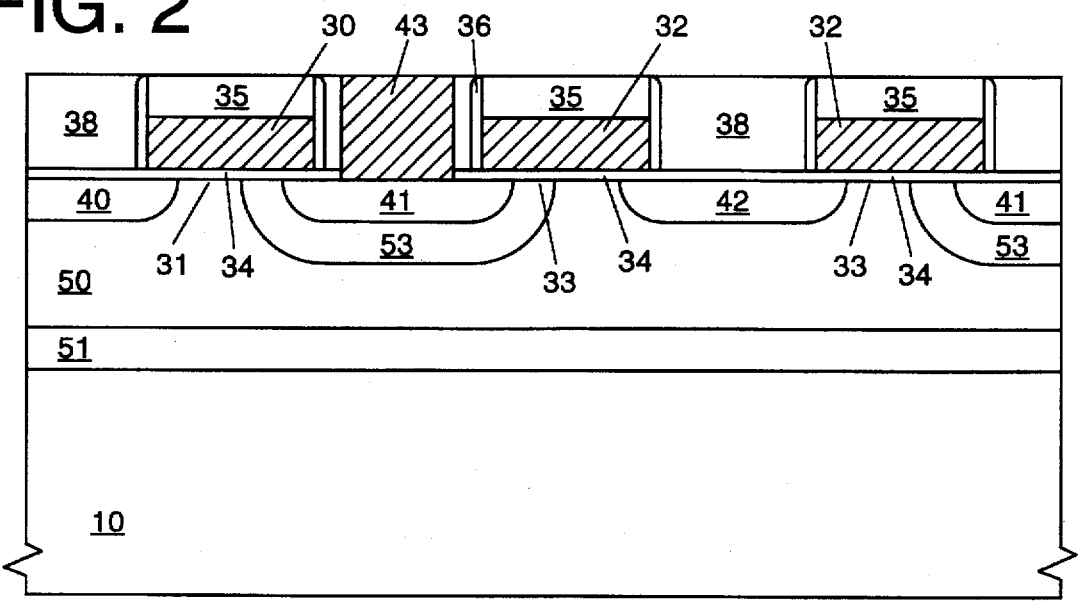
FIGS. 2 is a modification of FIG. 1C.

In FIG. 2, an additional doped region 53 is disposed entirely around storage node junction 41 within the substrate, and is also adjacent trench 20, and tends to reduce the portion of minority carriers reaching 41. FIG. 2 is the same cross section as shown in FIG. 1C and the present invention can be practiced according to either figure. FIG. 2 is more effective for reduction of leakage current at the storage node diffusion, but may not be preferable in all situations. Region 53 is of the same conductivity type as layer 50, but is of a higher, and usually non uniform, doping concentration. The doping gradient from a peak concentration in region 53 to lower concentration in layer 50 causes an internal electric field that tends to deflect some diffusing minority carriers away from node junction 41. The doping gradient and resulting field exist in the silicon bulk, and in the plane of the trench surface where it bounds region 53 and layer 50. Carriers thus deflected from junction 41 are more likely to be collected by junctions 40 and 42, thereby partially shielding junction 41, and improving data retention time of the memory. Note junction 42 need not be present for retention improvement to occur as a result of region 53. Bit line junctions 40 will collect some portion of the deflected carriers and act as a partial leakage shield. The thickness and doping concentration of layer 53 should preferably be such that the depletion layer around junction 41 is contained within a portion of layer 53.

Diffusion 42, together with word line 32 and channel region 33, constitute a storage node precharge circuit and can be operated as such. Alternatively, if a storage node precharge operation is not used, word line 32 can be kept biased to an off condition, and diffusion 42 will still serve as a leakage current shield for storage nodes 41. When biased to an off condition, word line 32 simply constitutes an isolating element between storage node diffusion 41 and adjacent structures. Mirror image precharge circuits exist on either side of a center line along diffusion 42.

Dielectric filled shallow trench isolation regions 37 bound bit line diffusion regions 40 on two sides. Another common isolation structure could be used instead.

Returning to FIG. 1A, the total area per bit of one DRAM cell and its corresponding precharge circuit is ideally eight square features as illustrated. The "height" of the bit area includes one feature for bit line diffusion 40 plus one feature for isolation 37, a total of two features. The "length" of the bit area includes one half feature for diffusion 40, plus one feature for access word line 30, plus one feature for node diffusion 41, plus one feature for precharge word line 32, plus one half feature for diffusion 42, a total of four features. A bit area is then two features by four features for a total of eight square features (i.e. $2F \times 4F = 8F^2$). The remaining halves of features 40 and 42 are associated with mirror image bits located to either side of the bit illustrated in FIG. 1A.

It should be noted that there are several other known operable combinations of conductivity type for layers 50 and 51, and plate region 10. For example, all three can be of the same conductivity type. Diffusions 40, 41, and 42 must then be of opposite conductivity type to region 10. Alternatively, layer 51 can be of opposite type to 50 and 10. Plate region 10 can even be a separate layer in a more complex total structure. All of these DRAM structures have been previously described. Those skilled in the art will recognize the present invention is also applicable to these other structures.

All of the word line, diffusion, and contact stud structures utilized in the forgoing description are subject to resistive limitations, and can be enhanced in conductivity by use of silicides and conductive straps as is often done. Further, parallel diffusions 42 can be connected together by orthogonal conductive elements to form a two dimensional grid. A two dimensional grid will better distribute a connected voltage and enhance uniformity of a precharge operation. Those skilled in the art will recognize how to utilize conventional conductivity enhancements that may be desired.

The present invention as illustrated in the figures can be fabricated using conventional and well known trench capacitor and planar semiconductor technology. It is preferred that doped region 53 be implanted using the planar word line structures as a mask so that the doping will be precisely disposed around diffusion 41, which is similarly implanted. An anneal after implant of region 53, and before implant of diffusion 41, will diffuse region 53 to an independently controllable depth for optimization of the overall design.

What is claimed is:

1. A memory array of dynamic random access memory cells formed on a semiconductor substrate, each said cell including a bit line junction, a storage node junction, a first transistor channel region disposed between said bit line junction and said storage node junction, a portion of a first word line gating said first transistor channel region, and a storage capacitor trench disposed adjacent said storage node junction, the improvement comprising:
   a. a third junction disposed adjacent said storage capacitor trench and physically spaced apart from said bit line and said storage node junctions, and
   b. a second word line substantially parallel and coplanar to said first word line and disposed so as to gate a second transistor channel region disposed between the storage node junction and said third junction.

2. A memory array according to claim 1 in which a reverse bias is applied to the third junction, whereby minority carriers are collected.

3. A memory array according to claim 1 in which said second word line is biased so as to isolate the storage node junction from the third junction.

4. A memory array according to claim 1 in which the bit line junction and storage node junction are of the same conductivity type as said semiconductor substrate.

5. A memory array according to claim 1 in which the bit line junction and storage node junction are of opposite conductivity type to said semiconductor substrate.

6. A memory array according to claim 1, further including a first doped region having a first doping concentration disposed around said storage node junction within said semiconductor substrate, and a second doped region having a second doping concentration disposed adjacent said first doped region and said bit line junction.

7. A memory array according to claim 1 in which a first reverse bias applied to the third junction is greater than a second reverse bias applied to the storage node junction.

8. A memory array of dynamic random access memory cells formed on a semiconductor substrate, each said cell including a bit line junction, a storage node junction, a first transistor channel region disposed between said bit line junction and said storage node junction, a portion of a first word line gating said first transistor channel region, and a storage capacitor trench disposed adjacent said storage node junction, the improvement comprising:
   a. a first doped region having a first doping concentration disposed entirely around said storage node junction within said semiconductor substrate, and
   b. a second doped region having a second doping concentration disposed adjacent said first doped region and said bit line junction, and
   c. a second word line substantially parallel and coplanar to said first word line, and disposed so as to at least partially gate a surface extending between the storage node junction and a third junction.

9. A memory array according to claim 8 in which a reverse bias is applied to the third junction, whereby minority carriers are collected.

10. A memory array according to claim 8 in which a bias is applied to said second word line so as to isolate the storage node junction from the third junction.

11. A memory array according to claim 8 in which the bit line junction and storage node junction are of the same conductivity type as said semiconductor substrate.

12. A memory array according to claim 8 in which the bit line junction and storage node junction are of opposite conductivity type to said semiconductor substrate.

13. An array of memory cells formed on a semiconductor substrate, each said cell including a first junction utilized as a storage node junction, a second junction utilized as a bit line junction, a first transistor channel region disposed between said first junction and said second junction, a portion of a first word line gating said first transistor channel region, and a storage capacitor trench, the improvement comprising:
   a. a third junction disposed apart from said first and second junctions, and
   b. a second word line substantially parallel and coplanar to said first word line and disposed so as to gate a second transistor channel region disposed between the first junction and said third junction.

14. An array according to claim 13 in which a reverse bias is applied to the third junction.

15. An array according to claim 13 in which said second word line is biased so as to isolate the first junction from the third junction.

16. An array according to claim 13 in which the first and second junctions are of the same conductivity type as said semiconductor substrate.

17. An array according to claim 13 in which the first and second junctions are of opposite conductivity type to said semiconductor substrate.

18. An array according to claim 13, further including a first doped region having a first doping concentration disposed around said first junction within said semiconductor substrate, and a second doped region having a second doping concentration disposed adjacent said first doped region and said second junction.

19. An array according to claim 13 in which a first reverse bias applied to the third junction is greater than a second reverse bias applied to the first junction.

20. An array according to claim 13 in which said third junction is disposed adjacent said storage capacitor trench.

* * * * *